US012640707B2

(12) United States Patent
Yasuda et al.

(10) Patent No.: US 12,640,707 B2
(45) Date of Patent: May 26, 2026

(54) RADIO-FREQUENCY MODULE AND COMMUNICATION DEVICE

(71) Applicant: Murata Manufacturing Co., Ltd., Nagaokakyo (JP)

(72) Inventors: Tomomi Yasuda, Nagaokakyo (JP); Syunsuke Kido, Nagaokakyo (JP); Masanori Kato, Nagaokakyo (JP); Takanori Uejima, Nagaokakyo (JP); Masanari Miura, Nagaokakyo (JP); Naru Morito, Nagaokakyo (JP); Yukiya Yamaguchi, Nagaokakyo (JP); Takuma Kuroyanagi, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 303 days.

(21) Appl. No.: 18/474,261

(22) Filed: Sep. 26, 2023

(65) Prior Publication Data

US 2024/0014805 A1     Jan. 11, 2024

Related U.S. Application Data

(63) Continuation of application No. PCT/JP2022/010875, filed on Mar. 11, 2022.

(30) Foreign Application Priority Data

Mar. 31, 2021     (JP) ................................ 2021-059154

(51) Int. Cl.
*H04B 1/40*     (2015.01)
*H01L 21/50*     (2006.01)
(Continued)

(52) U.S. Cl.
CPC ............. *H03H 9/542* (2013.01); *H03F 3/245* (2013.01); *H04B 1/40* (2013.01); *H03F 2200/294* (2013.01); *H03F 2200/451* (2013.01)

(58) Field of Classification Search
None
See application file for complete search history.

(56) References Cited

U.S. PATENT DOCUMENTS 7,084,718 B2 *   8/2006   Nakamura ........... H03H 9/0542
                                                        333/133
8,581,674 B2 *  11/2013   Tanaka ................. H03H 9/6436
                                                        333/195

(Continued)

FOREIGN PATENT DOCUMENTS

JP        2003209459 A   *   7/2003
JP        2019-528656 A       10/2019
(Continued)

OTHER PUBLICATIONS

International Search Report and Written Opinion mailed on May 10, 2022, received for PCT Application PCT/JP2022/010875, filed on Mar. 11, 2022, 10 pages including English Translation.

*Primary Examiner* — Pablo N Tran
(74) *Attorney, Agent, or Firm* — XSENSUS LLP

(57) ABSTRACT

A radio-frequency module includes a module substrate having main surfaces opposite to each other, a hybrid filter having a first acoustic wave resonator, a first inductor, and a first capacitor, and a first radio-frequency component, wherein a pass band width of the hybrid filter is greater than a resonant band width of the first acoustic wave resonator, one of the first acoustic wave resonator, the first inductor, and the first capacitor is disposed on the main surface, and the first radio-frequency component is disposed on the main surface.

16 Claims, 4 Drawing Sheets

(51) Int. Cl.
    *H01L 23/485*       (2006.01)
    *H03F 3/24*        (2006.01)
    *H03H 9/54*        (2006.01)

(56)           References Cited

U.S. PATENT DOCUMENTS

| | | | | |
|---|---|---|---|---|
| 8,659,368 | B2 * | 2/2014 | Komura | H03H 9/725 |
| | | | | 333/195 |
| 11,005,451 | B2 * | 5/2021 | Bauder | H03H 9/584 |
| 11,329,627 | B2 * | 5/2022 | Nakamura | H03H 9/6436 |
| 2011/0037170 | A1 * | 2/2011 | Shinohara | H01L 21/565 |
| | | | | 257/737 |
| 2012/0218052 | A1 * | 8/2012 | Tsurunari | H03H 9/02559 |
| | | | | 333/133 |
| 2023/0318573 | A1 * | 10/2023 | Kido | H04B 1/38 |

FOREIGN PATENT DOCUMENTS

| | | | |
|---|---|---|---|
| JP | 2020-005161 | A | 1/2020 |
| JP | 2020-014204 | A | 1/2020 |
| JP | 2021-048566 | A | 3/2021 |
| JP | 2021-052248 | A | 4/2021 |

* cited by examiner

RADIO-FREQUENCY MODULE AND COMMUNICATION DEVICE

CROSS-REFERENCE TO RELATED APPLICATIONS

This application is a continuation application of PCT International Application No. PCT/JP2022/010875 filed on Mar. 11, 2022, designating the United States of America, which is based on and claims priority of Japanese Patent Application No. 2021-059154 filed on Mar. 31, 2021. The entire disclosures of the above-identified applications, including the specifications, drawings and claims are incorporated herein by reference in their entirety.

TECHNICAL FIELD

The present disclosure relates to a radio-frequency module and a communication device.

BACKGROUND

Patent Document 1 discloses a hybrid acoustic LC filter including an acoustic resonator (acoustic wave resonator), an inductor, and a capacitor. With this, it is possible to achieve a relatively wide pass band and to satisfy strict out-of-band rejection specifications.

CITATION LIST

Patent Document

Patent Document 1: Japanese Unexamined Patent Application Publication No. 2020-14204

SUMMARY

Technical Problems

However, as recognized by the present inventor, since the hybrid acoustic LC filter disclosed in Patent Document 1 is a filter in which an acoustic wave resonator, an inductor and a capacitor are combined, the number of components is large. Thus, there is a problem that a radio-frequency module including the hybrid acoustic LC filter as one circuit component is increased in size.

Then, the present disclosure is made to solve the above-described problems, and to provide a small-sized radio-frequency module and a communication device including a hybrid filter in which an acoustic wave resonator, an inductor, and a capacitor are combined.

Solutions

A radio-frequency module according to an aspect of the present disclosure includes a substrate having a first main surface and a second main surface opposite to each other, a first hybrid filter having a first acoustic wave resonator, a first inductor, and a first capacitor, and a first radio-frequency component. A pass band width of the first hybrid filter is greater than a resonant band width of the first acoustic wave resonator, one of the first acoustic wave resonator, the first inductor, and the first capacitor is disposed on the first main surface, and the first radio-frequency component is disposed on the second main surface.

Advantageous Effects

According to the present disclosure, it is possible to provide a small-sized radio-frequency module and a communication device including a hybrid filter in which an acoustic wave resonator, an inductor, and a capacitor are combined.

DETAILED DESCRIPTION

Figure 1:
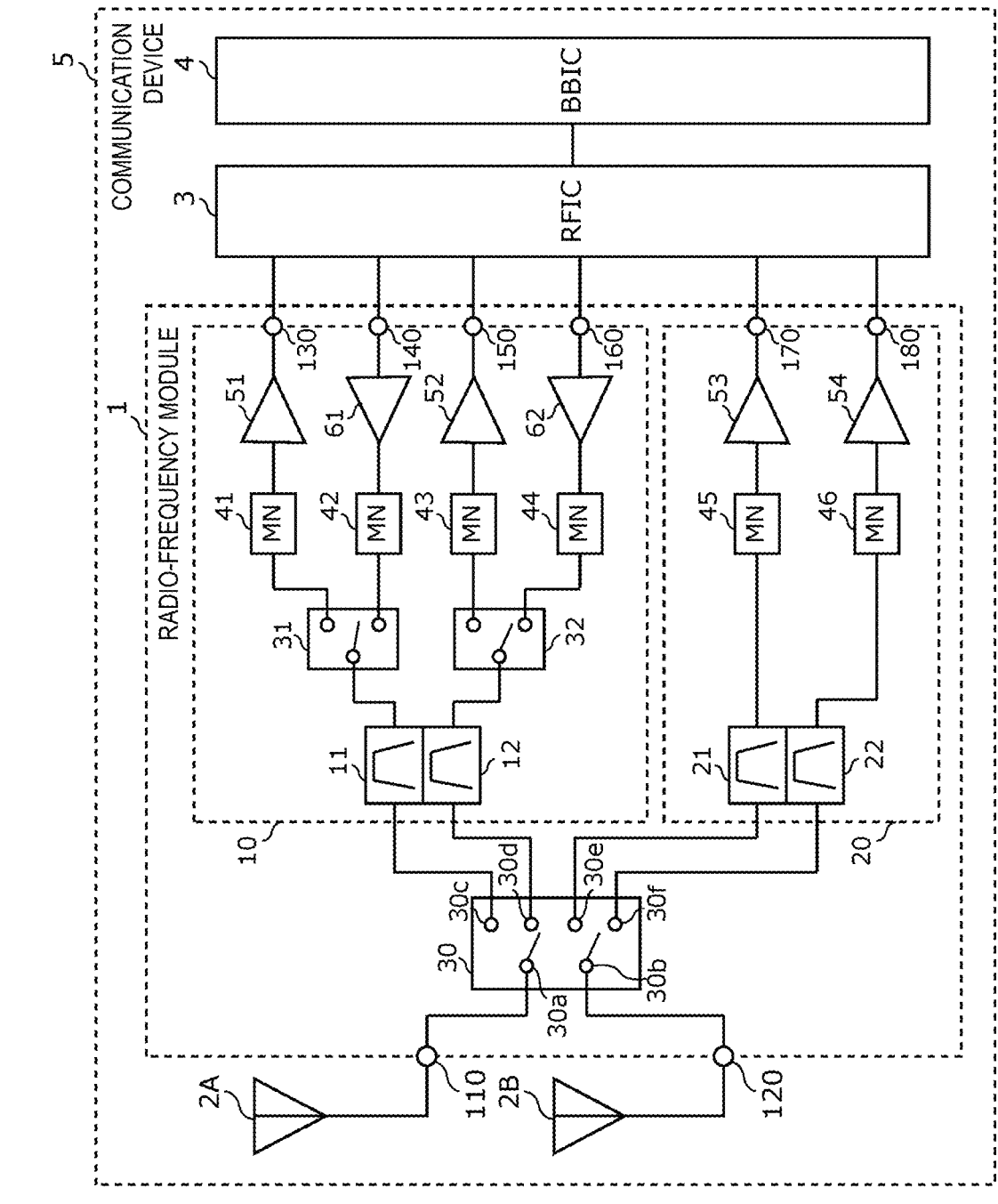
FIG. 1 is a circuit configuration diagram of a radio-frequency module and a communication device according to an embodiment.

Hereinafter, an embodiment of the present disclosure will be described in detail. Note that the embodiment described below illustrates a comprehensive or specific example. Numerical values, shapes, materials, constituent elements, disposition and connection modes of constituent elements, and the like illustrated in the following embodiment are mere examples and are not intended to limit the present disclosure. Among constituent elements in the following example and modification, constituent elements not recited in the independent claims are described as optional constituent elements. In addition, sizes or size ratios of constituent elements illustrated in the drawings are not necessarily precise. In each drawing, substantially the same configurations are denoted by the same reference numerals, and redundant description may be omitted or simplified.

In addition, in the following description, a term indicating a relationship between elements such as parallel or perpendicular, a term indicating a shape of an element such as a rectangular shape, and a numerical range represent not only a strict meaning but also a meaning including a substantially equivalent range, for example, a difference of about several %.

Further, in the following description, "A is disposed on a first main surface of a substrate" means not only that A is directly mounted on the first main surface but also that A is disposed in, of a space on the first main surface side and a space on a second main surface side separated by the substrate, a space on the first main surface side. That is, a case is included in which A is mounted on the first main surface with another circuit element, an electrode, or the like interposed therebetween.

In addition, in the following description, "connected" includes not only a case of being directly connected by using a connection terminal and/or a wiring conductor but also a case of being electrically connected via another circuit component. Furthermore, as used herein the terms "circuit" or "circuitry" means one or more circuits, including discrete circuit(s) as well as circuit board(s) and combinations thereof. In addition, "connected between A and B" means being connected to both A and B between A and B.

In each of the following drawings, an x-axis and a y-axis are axes orthogonal to each other on a plane parallel to a main surface of a module substrate. In addition, a z-axis is an axis perpendicular to the main surface of the module substrate, and a positive direction thereof indicates an upward direction and a negative direction thereof indicates a downward direction.

In addition, in a module configuration of the present disclosure, "in plan view" means that an object is viewed from a positive side of the z-axis by orthographic projection onto an xy plane. "A component is disposed on the main surface of the substrate" includes not only a case where the component is disposed on the main surface in a state of being in contact with the main surface of the substrate but also a case where the component is disposed above the main surface without being in contact with the main surface and a case where a part of the component is disposed so as to be embedded in the substrate from a side of the main surface.

In addition, in the following description, for A, B and C mounted on the substrate, "C is disposed between A and B in plan view of the substrate (or the main surface of the substrate)" means that at least one line segment of a plurality of line segments linking an arbitrary point in A and an arbitrary point in B in plan view of the substrate passes through a region of C. Further, "in plan view of the substrate" means that the substrate and a circuit element mounted on the substrate are viewed by orthographic projection onto a plane parallel to the main surface of the substrate.

In addition, in the following description, a "transmission path" means a transmission line configured with a wiring line through which a radio-frequency transmission signal propagates, an electrode directly connected to the wiring line, a terminal directly connected to the wiring line or the electrode, and the like. In addition, a "reception path" means a transmission line configured with a wiring line through which a radio-frequency reception signal propagates, an electrode directly connected to the wiring line, a terminal directly connected to the wiring line or the electrode, and the like.

Embodiment

[1. Configuration of Radio-Frequency Module 1 and Communication Device 5 According to Embodiment]

FIG. 1 is a circuit configuration diagram of a radio-frequency module 1 and a communication device 5 according to an embodiment. As illustrated in FIG. 1, the communication device 5 includes the radio-frequency module 1, antennas 2A and 2B, an RF signal processing circuit (RFIC) 3 and a baseband signal processing circuit (BBIC) 4. As used in this specification the term "module", as used with "radio frequency module" should be construed as circuitry (programmable, as well as discrete) and associated circuit components, such as circuit boards, RF shielding, etc.

The RFIC 3 is an RF signal processing circuit that processes radio-frequency signals transmitted and received by the antennas 2A and 2B. To be specific, the RFIC 3 applies a signal processing on a reception signal inputted via a reception path of the radio-frequency module 1 by down-conversion or the like, and outputs the reception signal generated by the signal processing to the BBIC 4. Further, the RFIC 3 outputs a radio-frequency transmission signal processed based on a signal inputted from the BBIC 4 to a transmission path of the radio-frequency module 1.

The BBIC 4 is a circuit that processes data using a signal having a frequency lower than that of a radio-frequency signal transmitted through the radio-frequency module 1.

The signal processed by the BBIC 4 is used, for example, as an image signal for image display or used as an audio signal for a call via a speaker.

In addition, the RFIC 3 has a function as a control unit that controls connection of switches 30, 31 and 32 included in the radio-frequency module 1 based on whether the radio-frequency module 1 is used for transmission or reception, and a communication band (frequency band) to be used. To be specific, the RFIC 3 switches the connection of the switches 30, 31 and 32 included in the radio-frequency module 1 by a control signal. Note that the control unit may be provided outside the RFIC 3, for example, or may be provided in the radio-frequency module 1 or the BBIC 4. Moreover, in one example the controller is a remote computer, or a distributed computer system that communicates with the radio frequency module 1 via a wireless or wired connection. Likewise, in another example, the controller is a local controller with a user interface that converts input signals into control commands that control the communication device 5 as well as subcomponents, such as the RF module 1.

Further, the RFIC 3 also has a function as a control unit that controls gains of power amplifiers 61 and 62 included in the radio-frequency module 1, and a power supply voltage Vcc and a bias voltage Vbias supplied to the power amplifiers 61 and 62.

The antenna 2A is connected to an antenna connection terminal 110 of the radio-frequency module 1 and radiates a radio-frequency signal outputted from the radio-frequency module 1 or receives a radio-frequency signal from outside and outputs the radio-frequency signal to the radio-frequency module 1. The antenna 2B is connected to an antenna connection terminal 120 of the radio-frequency module 1 and radiates a radio-frequency signal outputted from the radio-frequency module 1 or receives a radio-frequency signal from outside and outputs the radio-frequency signal to the radio-frequency module 1.

Note that in the communication device 5 according to the present embodiment, the antennas 2A, 2B and the BBIC 4 are not essential constituent elements.

Next, a detailed configuration of the radio-frequency module 1 will be described.

As illustrated in FIG. 1, the radio-frequency module 1 includes the antenna connection terminals 110 and 120, the switch 30, and radio-frequency circuits 10 and 20.

The antenna connection terminal 110 is a first antenna common terminal connected to the antenna 2A, and the antenna connection terminal 120 is a second antenna common terminal connected to the antenna 2B.

The switch 30 is an example of a first switch and includes common terminals 30a and 30b and selection terminals 30c, 30d, 30e and 30f, and switches between connection and disconnection between the common terminal 30a and at least one of the selection terminals 30c to 30f, and switches between connection and disconnection between the common terminal 30b and at least one of the selection terminals 30c to 30f. The common terminal 30a is connected to the antenna connection terminal 110. The common terminal 30b is connected to the antenna connection terminal 120. The selection terminal 30c is connected to a hybrid filter 11. The selection terminal 30d is connected to a filter 12. The selection terminal 30e is connected to a hybrid filter 21. The selection terminal 30f is connected to a filter 22. The switch 30 switches between connection and disconnection between the hybrid filter 11 and the antenna connection terminal 110, and switches between connection and disconnection between the hybrid filter 11 and the antenna connection terminal 120. Further, the switch 30 switches between connection and disconnection between the filter 12 and the antenna connection terminal 110, and switches between connection and disconnection between the filter 12 and the antenna connection terminal 120. Further, the switch 30 switches between connection and disconnection between the hybrid filter 21 and the antenna connection terminal 110, and switches between connection and disconnection between the hybrid filter 21 and the antenna connection terminal 120. Further, the switch 30 switches between connection and disconnection between the filter 22 and the antenna connection terminal 110, and switches between connection and disconnection between the filter 22 and the antenna connection terminal 120.

According to the above-described connection configuration of the switch 30, in the communication device 5, the antenna 2A can be connected to at least one of the hybrid filters 11 and 21 and the filters 12 and 22, and the antenna 2B can be connected to at least one of the hybrid filters 11 and 21 and the filters 12 and 22.

The radio-frequency circuit 10 includes reception output terminals 130 and 150, transmission input terminals 140 and 160, the hybrid filter 11, the filter 12, the switches 31 and 32, matching circuits 41, 42, 43 and 44, low-noise amplifiers 51 and 52, and the power amplifiers 61 and 62.

The hybrid filter 11 is an example of a first hybrid filter and is a filter including one or more first acoustic wave resonators, one or more first inductors, and one or more first capacitors. One terminal of the hybrid filter 11 is connected to the selection terminal 30c, and another terminal is connected to the switch 31.

The filter 12 is an example of a first filter, and is a filter including one or more third acoustic wave resonators and one or more fourth inductors. One terminal of the filter 12 is connected to the selection terminal 30d, and another terminal is connected to the switch 32.

Note that each of the first acoustic wave resonator and a third acoustic wave element is, for example, an acoustic wave resonator in which a surface acoustic wave (SAW) is used or an acoustic wave resonator in which a bulk acoustic wave (BAW) is used.

Figure 2A:
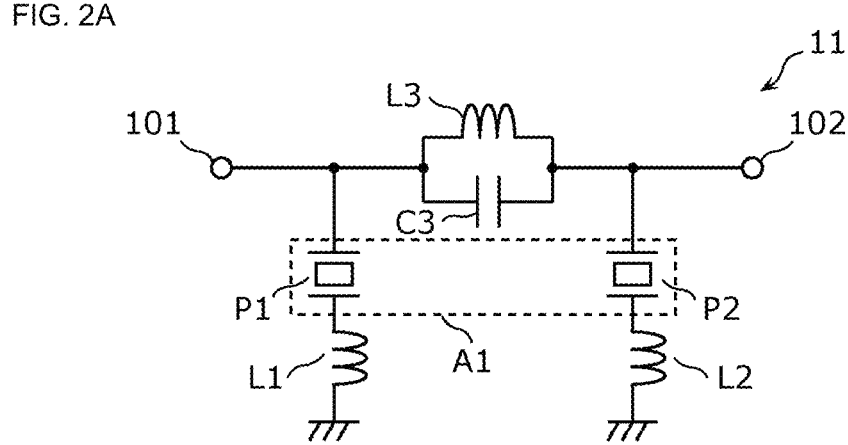
FIG. 2A is a diagram illustrating an example of a circuit configuration of a first hybrid filter according to the embodiment.

FIG. 2A is a diagram illustrating an example of a circuit configuration of the hybrid filter 11 according to the embodiment. As illustrated in FIG. 2A, the hybrid filter 11 includes acoustic wave resonators P1 and P2, a capacitor C3, and inductors L1, L2, and L3. Each of the acoustic wave resonators P1 and P2 is an example of the first acoustic wave resonator, each of the inductors L1, L2, and L3 is an example of the first inductor, and the capacitor C3 is an example of the first capacitor.

The inductor L3 and the capacitor C3 constitute an LC parallel resonant circuit. A series connection circuit of the acoustic wave resonator P1 and the inductor L1 is disposed between a node on a path linking an input/output terminal 101 and the above LC parallel resonant circuit, and a ground. A series connection circuit of the acoustic wave resonator P2 and the inductor L2 is disposed between a node on a path linking an input/output terminal 102 and the above LC parallel resonant circuit, and the ground. The acoustic wave resonators P1 and P2 form an acoustic wave resonator A1, and are formed as one chip, for example. Note that "a plurality of acoustic wave resonators is formed as one chip" is defined as "the plurality of acoustic wave resonators is formed on one piezoelectric substrate" or "the plurality of acoustic wave resonators is included in one package".

In the above-described configuration, a pass band and an attenuation band of the hybrid filter 11 are formed by adjusting a resonant frequency of the LC parallel resonant circuit including the inductor L3 and the capacitor C3, and a resonant frequency and an anti-resonant frequency of each of the acoustic wave resonators P1 and P2. The pass band of the hybrid filter 11 is formed by the LC parallel resonant circuit including the inductor L3 and the capacitor C3, and an attenuation pole is formed by the acoustic wave resonators P1 and P2.

That is, in the hybrid filter 11, a wide pass band that cannot be achieved by the acoustic wave resonator can be ensured by the LC circuit, and a steep attenuation slope that cannot be achieved by the LC circuit can be ensured by the acoustic wave resonator.

From this point of view, a pass band width of the hybrid filter 11 is greater than a resonant band width of each of the acoustic wave resonators P1 and P2.

Note that in the present embodiment, a resonant band width of an acoustic wave resonator is defined as a difference between an anti-resonant frequency and a resonant frequency of the acoustic wave resonator. Further, a resonant band width ratio is defined as a ratio obtained by dividing the above resonant band width by an intermediate value between the anti-resonant frequency and the resonant frequency. It is known that general SAW resonators and BAW resonators each have a resonant band width ratio from 3 to 4% in a frequency band from 0.1 to 10 GHz.

Note that the filter 12 need not include a capacitor, and a pass band width of the filter 12 may be equal to or less than a resonant band width of the third acoustic wave resonator.

Referring back to FIG. 1, circuit components of the radio-frequency circuit 10 will be described.

The low-noise amplifier 51 is an example of a first low-noise amplifier, and is an amplifier that amplifies a reception signal in a first communication band with low noise, and outputs the amplified reception signal to the reception output terminal 130. The low-noise amplifier 52 is an amplifier that amplifies a reception signal in a second communication band with low noise, and outputs the amplified reception signal to the reception output terminal 150.

The power amplifier 61 is an example of a first power amplifier and is an amplifier that amplifies a transmission signal in the first communication band inputted from the transmission input terminal 140. The power amplifier 62 is an amplifier that amplifies a transmission signal in the second communication band inputted from the transmission input terminal 160.

The matching circuit 41 is connected between the low-noise amplifier 51 and the switch 31, and achieves impedance matching between the low-noise amplifier 51 and the switch 31. The matching circuit 42 is connected between the power amplifier 61 and the switch 31, and achieves impedance matching between the power amplifier 61 and the switch 31. The matching circuit 43 is connected between the low-noise amplifier 52 and the switch 32, and achieves impedance matching between the low-noise amplifier 52 and the switch 32. The matching circuit 44 is connected between the power amplifier 62 and the switch 32, and achieves impedance matching between the power amplifier 62 and the switch 32.

The switch 31 is an example of a second switch, and has a common terminal and two selection terminals. The common terminal of the switch 31 is connected to the hybrid filter 11. One selection terminal of the switch 31 is connected to an input terminal of the low-noise amplifier 51 via the matching circuit 41, and another selection terminal of the switch 31 is connected to an output terminal of the power amplifier 61 via the matching circuit 42. That is, the switch 31 is a time division duplex (TDD) switch that is connected to the hybrid filter 11, the low-noise amplifier 51 and the power amplifier 61, and switches between connection between the hybrid filter 11 and the low-noise amplifier 51 and connection between the hybrid filter 11 and the power amplifier 61. The switch 31 is configured with, for example, a single-pole double-throw (SPDT) type switch circuit.

By the switch 31, the hybrid filter 11 functions as a transmission-and-reception filter connected to the low-noise amplifier 51 and the power amplifier 61.

The switch 32 has a common terminal and two selection terminals. The common terminal of the switch 32 is connected to the filter 12. One selection terminal of the switch 32 is connected to the low-noise amplifier 52 via the matching circuit 43, and another selection terminal of the switch 32 is connected to the power amplifier 62 via the matching circuit 44. That is, the switch 32 is a TDD switch that switches between connection between the filter 12 and the low-noise amplifier 52 and connection between the filter 12 and the power amplifier 62. The switch 32 is configured with, for example, an SPDT type switch circuit.

By the switch 32, the filter 12 functions as a transmission-and-reception filter connected to the low-noise amplifier 52 and the power amplifier 62.

The radio-frequency circuit 20 includes reception output terminals 170 and 180, the hybrid filter 21, the filter 22, matching circuits 45 and 46, and low-noise amplifiers 53 and 54.

The hybrid filter 21 is an example of a second hybrid filter, and is a filter including one or more second acoustic wave resonators, one or more second inductors, and one or more second capacitors. One terminal of the hybrid filter 21 is connected to the selection terminal 30e, and another terminal is connected to the low-noise amplifier 53 via the matching circuit 45. Note that the hybrid filter 21 is not connected to a power amplifier.

According to the above, the hybrid filter 21 functions as a reception-only filter connected between the switch 30 and the low-noise amplifier 53.

The filter 22 is an example of a second filter, and is a filter including one or more fourth acoustic wave resonators and one or more fifth inductors. One terminal of the filter 22 is connected to the selection terminal 30f, and another terminal is connected to the low-noise amplifier 54 via the matching circuit 46. Note that the filter 22 is not connected to a power amplifier.

According to the above, the filter 22 functions as a reception-only filter connected to the switch 30.

Note that each of the second acoustic wave resonator and a fourth acoustic wave element is, for example, an acoustic wave resonator in which a SAW is used or an acoustic wave resonator in which a BAW is used.

Figure 2B:
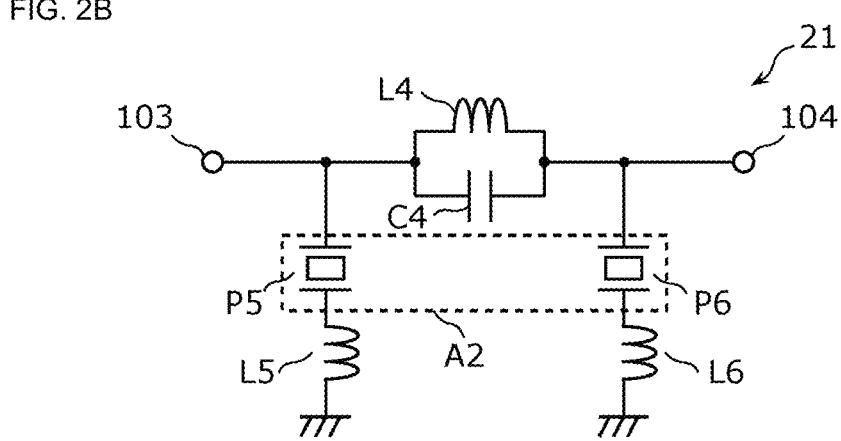
FIG. 2B is a diagram illustrating an example of a circuit configuration of a second hybrid filter according to the embodiment.

FIG. 2B is a diagram illustrating an example of a circuit configuration of the hybrid filter 21 according to the embodiment. As illustrated in FIG. 2B, the hybrid filter 21 includes acoustic wave resonators P5 and P6, a capacitor C4, and inductors L4, L5, and L6. Each of the acoustic wave resonators P5 and P6 is an example of the second acoustic wave resonator, each of the inductors L4, L5, and L6 is an example of the second inductor, and the capacitor C4 is an example of the second capacitor.

The inductor L4 and the capacitor C4 constitute an LC parallel resonant circuit. A series connection circuit of the acoustic wave resonator P5 and the inductor L5 is disposed between a node on a path linking an input/output terminal 103 and the above LC parallel resonant circuit, and the ground. A series connection circuit of the acoustic wave resonator P6 and the inductor L6 is disposed between a node on a path linking an input/output terminal 104 and the above LC parallel resonant circuit, and the ground. The acoustic wave resonators P5 and P6 form an acoustic wave resonator A2, and are formed as one chip, for example.

In the above-described configuration, a pass band and an attenuation band of the hybrid filter 21 are formed by adjusting a resonant frequency of the LC parallel resonant circuit including the inductor L4 and the capacitor C4, and a resonant frequency and an anti-resonant frequency of each of the acoustic wave resonators P5 and P6. The pass band of the hybrid filter 21 is formed by the LC parallel resonant circuit including the inductor L4 and the capacitor C4, and an attenuation pole is formed by the acoustic wave resonators P5 and P6.

That is, in the hybrid filter 21, a wide pass band that cannot be achieved by the acoustic wave resonator can be ensured by the LC circuit, and a steep attenuation slope that cannot be achieved by the LC circuit can be ensured by the acoustic wave resonator.

From this point of view, a pass band width of the hybrid filter 21 is greater than a resonant band width of each of the acoustic wave resonators P5 and P6.

Note that the filter 22 need not include a capacitor, and a pass band width of the filter 22 may be equal to or less than a resonant band width of the fourth acoustic wave resonator.

Referring back to FIG. 1, circuit components of the radio-frequency circuit 20 will be described.

The low-noise amplifier 53 is an example of a second low-noise amplifier, and is an amplifier that amplifies a reception signal in the first communication band with low noise, and outputs the amplified reception signal to the reception output terminal 170. The low-noise amplifier 54 is an amplifier that amplifies a reception signal in the second communication band with low noise, and outputs the amplified reception signal to the reception output terminal 180.

The matching circuit 45 is connected between the low-noise amplifier 53 and the hybrid filter 21, and achieves impedance matching between the low-noise amplifier 53 and the hybrid filter 21. The matching circuit 46 is connected between the low-noise amplifier 54 and the filter 22, and achieves impedance matching between the low-noise amplifier 54 and the filter 22.

According to the above-described circuit configuration, the radio-frequency module 1 can independently transmit a transmission signal in the first communication band, a reception signal in the first communication band, a transmission signal in the second communication band, and a reception signal in the second communication band, or can simultaneously transmit at least two types of the signals.

Note that the pass band of each of the hybrid filters 11 and 21 includes, for example, n77 of 5G-NR, and the pass band of each of the filters 12 and 22 includes, for example, n79 of 5G-NR.

Note that at least two or more of the low-noise amplifiers 51, 52, 53 and 54, and the switches 30, 31 and 32 may be formed in a single semiconductor IC. The semiconductor integrated circuit (IC) is configured with, for example, a CMOS. Specifically, the semiconductor IC is formed by an SOI process. Thus, the semiconductor IC can be manufactured at low cost. Note that the semiconductor IC may be made of at least one of GaAs, SiGe, and GaN. Thus, it is possible to output a radio-frequency signal having high-quality amplification performance and noise performance.

Note that the circuit configurations of the hybrid filters 11 and 21 according to the present embodiment are not limited to the circuit configurations illustrated in FIG. 2A and FIG.

2B. It is sufficient that each of the hybrid filters 11 and 21 according to the present embodiment includes one or more acoustic wave resonators, one or more inductors, and one or more capacitors, and a pass band width of the hybrid filter is greater than a resonant band width of the acoustic wave resonator. In addition, in the circuit configuration of each of the hybrid filters 11 and 21 according to the present embodiment, no switch is disposed between the acoustic wave resonator and the LC circuit. For example, in the hybrid filter 11, no switch is inserted between the LC parallel resonant circuit, including the inductor L3 and the capacitor C3, and the acoustic wave resonator P1 or between the LC parallel resonant circuit and the acoustic wave resonator P2.

Further, the one terminal of the hybrid filter 11 and the one terminal of the filter 12 may be connected to the same selection terminal of the switch 30. Further, the one terminal of the hybrid filter 21 and the one terminal of the filter 22 may be connected to the same selection terminal of the switch 30.

Further, a filter may be connected to each of between the switch 31 and the low-noise amplifier 51, between the switch 31 and the power amplifier 61, between the switch 32 and the low-noise amplifier 52, and between the switch 32 and the power amplifier 62.

Note that the radio-frequency module 1 according to the present embodiment only needs to include at least the hybrid filter 11 and the low-noise amplifier 51 among the circuit components and the circuit elements illustrated in FIG. 1.

Here, since the radio-frequency module 1 having the above-described circuit configuration includes the hybrid filter in which the acoustic wave resonator, the inductor and the capacitor are combined, there is a problem in that the number of components is large and a size thereof is large. In addition, when a mounting density is increased for reduction in size, there is a problem in that unnecessary coupling between the components occurs and bandpass characteristics of the radio-frequency module 1 are deteriorated.

On the other hand, a configuration of the radio-frequency module 1 which is reduced in size while deterioration of the bandpass characteristics is suppressed will be described below.

[2. Disposition Configuration of Circuit Elements of Radio-Frequency Module 1A According to Example]

Figure 3A:
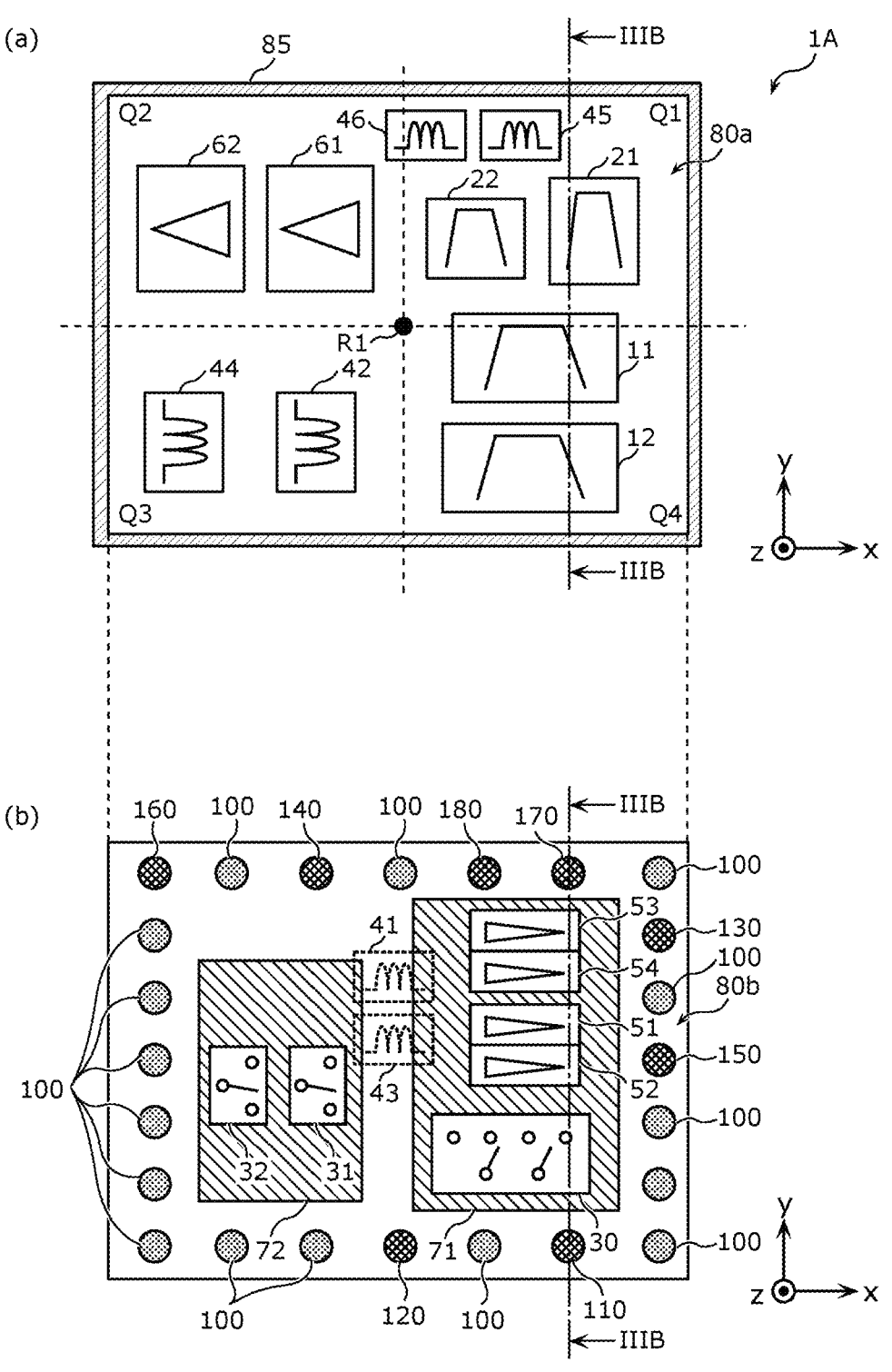
FIG. 3A is a schematic plan configuration diagram of a radio-frequency module according to an example.
Figure 3B:
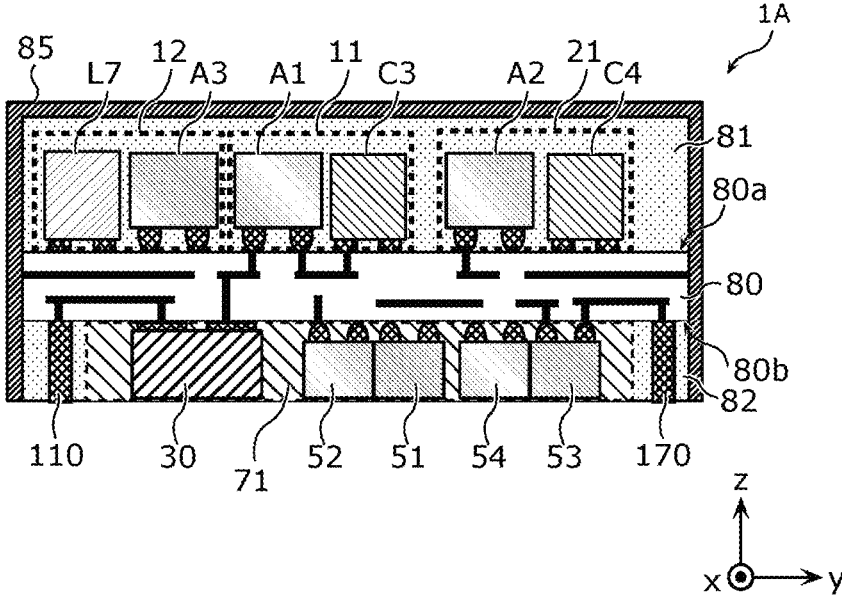
FIG. 3B is a schematic sectional configuration diagram of the radio-frequency module according to the example.

FIG. 3A is a schematic plan configuration diagram of a radio-frequency module 1A according to an example. Further, FIG. 3B is a schematic sectional configuration diagram of the radio-frequency module 1A according to the example, specifically, is a sectional view taken along a line IIIB-IIIB in FIG. 3A. Note that (a) of FIG. 3A illustrates a layout drawing of circuit components when, of main surfaces 80a and 80b of a module substrate 80 facing each other, the main surface 80a is viewed from a positive direction side of the z-axis. On the other hand, (b) of FIG. 3A is a diagram in which disposition of the circuit components is seen through the main surface 80b when viewed from the positive direction side of the z-axis. In addition, in FIG. 3A, in order to easily understand a disposition relationship among the circuit components, a mark indicating a function of each circuit component is added to each circuit component, but the mark is not added to the radio-frequency module 1A in reality.

The radio-frequency module 1A according to the example specifically illustrates a disposition configuration of the circuit elements constituting the radio-frequency module 1 according to the embodiment.

As illustrated in 3A and 3B, the radio-frequency module 1A according to the present example further has the module substrate 80, resin members 81 and 82, an external connection terminal 100 and a metal shield layer 85, in addition to the circuit configuration illustrated in FIG. 1.

The module substrate 80 is an example of a substrate, has the main surface 80a and the main surface 80b opposite to each other, and is a substrate on which circuit components constituting the radio-frequency module 1A are mounted. As the module substrate 80, for example, a low temperature co-fired ceramics (LTCC) substrate having a laminated structure of a plurality of dielectric layers, a high temperature co-fired ceramics (HTCC) substrate, a component built-in substrate, a substrate having a redistribution layer (RDL), a printed substrate, or the like is used.

Note that in the present example, the main surface 80a corresponds to a first main surface, and the main surface 80b corresponds to a second main surface.

Note that the module substrate 80 is an example of the substrate, and it is desirable that a multilayer structure in which a plurality of dielectric layers is stacked is included, and a ground electrode pattern is formed on at least one dielectric layer of the plurality of dielectric layers. Thus, an electromagnetic field shielding function of the module substrate 80 is improved.

Note that as illustrated in (b) of FIG. 3A, the antenna connection terminals 110 and 120, the transmission input terminals 140 and 160, and the reception output terminals 130, 150, 170 and 180 may be formed on the main surface 80b.

The resin member 81 is disposed on the main surface 80a and covers some of the circuit components constituting the radio-frequency module 1A and the main surface 80a. The resin member 82 is disposed on the main surface 80b and covers some of the circuit components constituting the radio-frequency module 1A and the main surface 80b. The resin members 81 and 82 have a function to ensure reliability such as mechanical strength and moisture resistance of the circuit components constituting the radio-frequency module 1A.

The metal shield layer 85 covers a surface of the resin member 81 and is set to a ground potential. The metal shield layer 85 is, for example, a metal thin film formed by sputtering.

Note that the resin members 81 and 82 and the metal shield layer 85 are not constituent elements essential for the radio-frequency module 1 according to the present embodiment.

In the present example, each of the matching circuits 41 to 46 includes an inductor.

Note that in FIG. 3A, the wiring lines connecting the circuit components illustrated in FIG. 1 are formed inside the module substrate 80 and on the main surfaces 80a and 80b. Further, the above wiring lines may each be a bonding wire both ends of which are bonded to the main surfaces 80a and 80b and the circuit components constituting the radio-frequency module 1A, or may be a terminal, an electrode or a wiring line formed on a surface of the circuit component constituting the radio-frequency module 1A.

As illustrated in FIG. 3A, in the radio-frequency module 1A according to the present example, the hybrid filters 11 and 21, the filters 12 and 22, the power amplifiers 61 and 62, and the matching circuits 42, 44, 45 and 46 are disposed on the main surface 80a. On the other hand, the switches 30, 31 and 32 and the low-noise amplifiers 51, 52, 53 and 54 are disposed on the main surface 80b. Further, the matching circuits 41 and 43 are disposed inside the module substrate 80. The low-noise amplifier 51 is an example of a first radio-frequency component disposed on the main surface 80b.

According to the above-described configuration, the hybrid filter 11 and the low-noise amplifier 51 being the first radio-frequency component that constitute the radio-frequency module 1A are distributed to and disposed on both the surfaces of the module substrate 80 with the module substrate 80 interposed therebetween. Thus, the radio-frequency module 1A can be reduced in size.

In the present example, the acoustic wave resonators P1 and P2, the capacitor C3, and the inductors L1, L2, and L3 that constitute the hybrid filter 11 are disposed on the main surface 80*a*. Note that it is sufficient that at least one of the acoustic wave resonators P1 and P2, the capacitor C3, and the inductors L1, L2, and L3 is disposed on the main surface 80*a*, and at least another one may be disposed inside the module substrate 80 or on the main surface 80*b*. Further, the first radio-frequency component disposed on the main surface 80*b* may be one of the low-noise amplifiers 52 to 54 and the switches 30 to 32.

According to the above, since some of the circuit elements of the hybrid filter 11 and the first radio-frequency component are distributed to and disposed on both the surfaces of the module substrate 80 with the module substrate 80 interposed therebetween, the radio-frequency module 1A can be reduced in size.

In addition, in the radio-frequency module 1A according to the present example, a plurality of the external connection terminals 100 is disposed on the main surface 80*b*. The radio-frequency module 1A exchanges electric signals with an external substrate disposed on a negative direction side of the z-axis of the radio-frequency module 1A via the plurality of external connection terminals 100. Some external connection terminals of the plurality of external connection terminals 100 may be the antenna connection terminals 110 and 120, the transmission input terminals 140 and 160, and the reception output terminals 130, 150, 170, and 180 as illustrated in (b) of FIG. 3A. Further, some other external connection terminals of the plurality of external connection terminals 100 are set to a ground potential of the external substrate.

Note that the external connection terminal 100 may be a columnar electrode penetrating the resin member 82 in a z-axis direction as illustrated in FIG. 3A and FIG. 3B, or the external connection terminal 100 may be a bump electrode formed on the main surface 80*b*. In this case, the resin member 82 on the main surface 80*b* need not be present.

On the main surface 80*b* facing the external substrate, of the main surfaces 80*a* and 80*b*, circuit components that are difficult to be reduced in height are not disposed, and the low-noise amplifiers 51 to 54 and the switches 30 to 32 that are easy to be reduced in height are disposed.

Here, as illustrated in FIG. 3A and FIG. 3B, in plan view of the module substrate 80, the hybrid filter 11 and the switch 30 at least partially overlap each other.

According to the above, the hybrid filter 11 through which both a transmission signal and a reception signal pass and the switch 30 can be connected to each other mainly by a via wiring line formed in the module substrate 80 along a vertical direction of the module substrate 80. Thus, a wiring line linking the hybrid filter 11 and the switch 30 can be shortened, and transmission losses of a transmission signal and a reception signal in the first communication band can be reduced.

Further, the acoustic wave resonators P5 and P6, the capacitor C4, and the inductors L4, L5, and L6 that constitute the hybrid filter 21 are disposed on the main surface 80*a*.

On the other hand, the low-noise amplifier 53 connected to the hybrid filter 21 via the matching circuit 45 is disposed on the main surface 80*b*.

Here, as illustrated in FIG. 3A and FIG. 3B, in plan view of the module substrate 80, the hybrid filter 21 and the low-noise amplifier 53 at least partially overlap each other.

According to the above, the hybrid filter 21 and the low-noise amplifier 53 can be connected to each other mainly by a via wiring line formed in the module substrate 80 along the vertical direction of the module substrate 80. Thus, a wiring line linking the hybrid filter 21 and the low-noise amplifier 53 can be shortened, and a transmission loss of a reception signal in the first communication band can be reduced.

Note that it is sufficient that at least one of the acoustic wave resonators P5 and P6, the capacitor C4, and the inductors L4, L5, and L6 is disposed on the main surface 80*a*, and at least another one may be disposed inside the module substrate 80 or on the main surface 80*b*. According to the above, since some of the circuit elements of the hybrid filter 21 and the low-noise amplifier 53 are distributed to and disposed on both the surfaces of the module substrate 80 with the module substrate 80 interposed therebetween, the radio-frequency module 1A can be reduced in size.

Further, the low-noise amplifiers 51 to 54 and the switch 30 are included in a semiconductor IC 71. According to the above, the low-noise amplifiers 51 to 54 and the switch 30 can be reduced in size and height.

Further, the switches 31 and 32 are included in a semiconductor IC 72. According to the above, the switches 31 and 32 can be reduced in size and height.

Since the semiconductor ICs 71 and 72 are disposed on the main surface 80*b*, the radio-frequency module 1A can be reduced in height.

Further, a distance between a third inductor included in the matching circuit 42 and the hybrid filter 11 is shorter than a distance between the third inductor and the hybrid filter 21.

According to the above, a wiring line linking the hybrid filter 11 and the third inductor can be shortened, thus a transmission loss of a high-output transmission signal in the first communication band can be reduced and power consumption can be reduced.

Additionally, as illustrated in (b) of FIG. 3A, in plan view of the module substrate 80, (1) a first quadrant Q1 which is a region on a right side and an upper side of a reference point R1 on the module substrate 80, (2) a second quadrant Q2 which is a region on a left side and the upper side of the reference point R1, (3) a third quadrant Q3 which is a region on the left side and a lower side of the reference point R1, and (4) a fourth quadrant Q4 which is a region on the right side and the lower side of the reference point R1 are defined. In this case, at least a part of the hybrid filter 21 is disposed in the first quadrant Q1, at least a part of the power amplifier 61 is disposed in the second quadrant Q2, at least a part of the third inductor is disposed in the third quadrant Q3, and at least a part of the hybrid filter 11 is disposed in the fourth quadrant Q4.

According to the above, the power amplifier 61, the third inductor, and the hybrid filter 11 that constitute a transmission path for transmitting a transmission signal in the first communication band are disposed in this order counterclockwise around the reference point R1. Thus, since the transmission path for transmitting a transmission signal in the first communication band can be shortened, a transmission loss of a high-output transmission signal in the first communication band can be reduced, and power consumption can be reduced.

Note that the reference point R1 on the module substrate 80 is defined as an arbitrary one point on the module substrate 80 excluding an outer edge of the module substrate 80 in plan view of the module substrate 80. In other words, the reference point R1 is a point disposed on the module substrate 80 such that the first quadrant Q1, the second quadrant Q2, the third quadrant Q3 and the fourth quadrant Q4 can be present on the module substrate 80 in plan view of the module substrate 80.

[3. Disposition Configuration of Circuit Elements of Radio-Frequency Module 1B According to Modification]

Figure 3C:
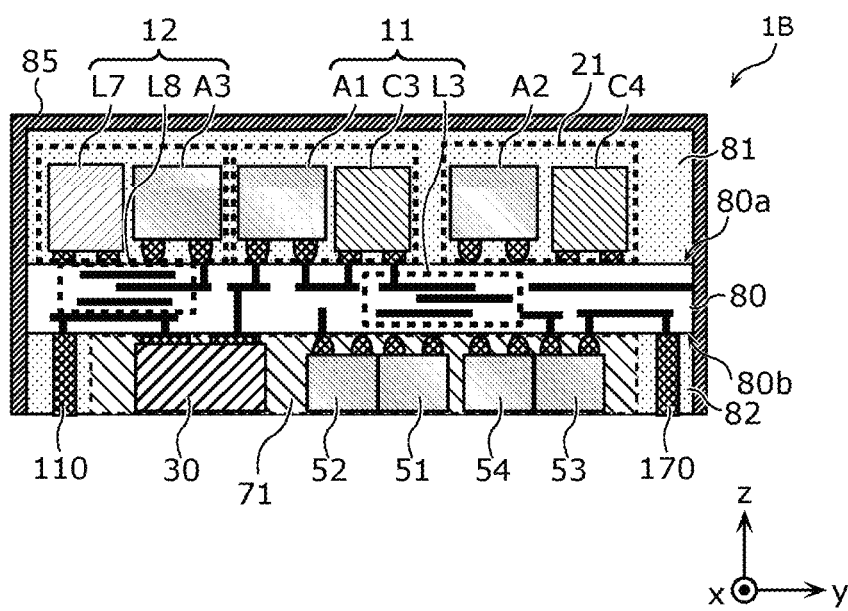
FIG. 3C is a schematic sectional configuration diagram of a radio-frequency module according to a modification.

FIG. 3C is a schematic sectional configuration diagram of a radio-frequency module 1B according to a modification. The radio-frequency module 1B according to the modification specifically illustrates a disposition configuration of the circuit elements constituting the radio-frequency module 1 according to the embodiment.

The radio-frequency module 1B illustrated in FIG. 3C is different from the radio-frequency module 1A according to the example in a disposition configuration of the circuit elements constituting the hybrid filter 11 and the filter 12. Hereinafter, with respect to the radio-frequency module 1B according to the present modification, a description of the same configuration as that of the radio-frequency module 1A according to the example will be omitted, and a description will be given focusing on a different configuration.

The hybrid filter 11 includes the acoustic wave resonator A1 (acoustic wave resonators P1 and P2), the capacitor C3, and the inductors L1, L2, and L3.

The filter 12 includes an acoustic wave resonator A3 and inductors L7 and L8.

Here, in the hybrid filter 11, the acoustic wave resonator A1 and the capacitor C3 are disposed on the main surface 80a, and the inductor L3 is formed inside the module substrate 80. The inductor L3 is configured with, for example, a plurality of planar coil conductors and a via conductor that connects the planar coil conductors.

Here, in the filter 12, the acoustic wave resonator A3 and the inductor L7 are disposed on the main surface 80a, and the inductor L8 is formed inside the module substrate 80. The inductor L8 is configured with, for example, a plurality of planar coil conductors and a via conductor that connects the planar coil conductors.

According to the above configuration, some of the circuit elements constituting the hybrid filter 11 are disposed on the main surface 80a, and the other circuit elements are formed inside the module substrate 80, thus the radio-frequency module 1B can be reduced in size.

Note that the circuit element formed inside the module substrate 80 may be any of the acoustic wave resonator and the capacitor.

[4. Effects and the Like]

As described above, the radio-frequency module 1 according to the embodiment includes the module substrate 80 having the main surfaces 80a and 80b opposite to each other, the hybrid filter 11 having the first acoustic wave resonator, the first inductor, and the first capacitor, and the first radio-frequency component. The pass band width of the hybrid filter 11 is greater than the resonant band width of the first acoustic wave resonator, one of the first acoustic wave resonator, the first inductor, and the first capacitor is disposed on the main surface 80a, and the first radio-frequency component is disposed on the main surface 80b.

According to the above, the hybrid filter 11 and the first radio-frequency component that constitute the radio-frequency module 1A are distributed to and disposed on both the surfaces of the module substrate 80 with the module substrate 80 interposed therebetween. Thus, the radio-frequency module 1A can be reduced in size.

In addition, in the radio-frequency module 1A according to the example and the radio-frequency module 1B according to the modification, the first acoustic wave resonator may be disposed either on the main surface 80a or inside the module substrate 80, the first inductor may be disposed either on the main surface 80a or inside the module substrate 80, and the first capacitor may be disposed either on the main surface 80a or inside the module substrate 80.

In addition, in the radio-frequency module 1, the first radio-frequency component may be the low-noise amplifier 51, the radio-frequency modules 1A and 1B may each further include the external connection terminal 100 disposed on the main surface 80b, the power amplifier 61, the switch 30 connected to the hybrid filter 11 for switching between connection and disconnection between the hybrid filter 11 and the antenna connection terminal 110, and the switch 31 connected to the hybrid filter 11, the low-noise amplifier 51, and the power amplifier 61 for switching between connection between the hybrid filter 11 and the low-noise amplifier 51 and connection between the hybrid filter 11 and the power amplifier 61, the hybrid filter 11 may be a transmission-and-reception filter connected to the low-noise amplifier 51 and the power amplifier 61, and in plan view of the module substrate 80, the hybrid filter 11 and the switch 31 may at least partially overlap each other.

According to the above, the hybrid filter 11 through which both a transmission signal and a reception signal pass and the switch 30 can be connected to each other mainly by the via wiring line formed in the module substrate 80 along the vertical direction of the module substrate 80. Thus, the wiring line linking the hybrid filter 11 and the switch 30 can be shortened, and transmission losses of a transmission signal and a reception signal in the first communication band can be reduced.

Further, the radio-frequency module 1 may further include the hybrid filter 21 having the second acoustic wave resonator, the second inductor, and the second capacitor, and the low-noise amplifier 53 disposed on the main surface 80b, the pass band width of the hybrid filter 21 may be greater than the resonant band width of the second acoustic wave resonator, one of the second acoustic wave resonator, the second inductor, and the second capacitor may be disposed on the main surface 80a, the hybrid filter 21 may be a reception-only filter connected between the switch 30 and the low-noise amplifier 53, and in plan view of the module substrate 80, the hybrid filter 21 and the low-noise amplifier 53 may at least partially overlap each other.

According to the above, the hybrid filter 21 and the low-noise amplifier 53 can be connected to each other mainly by the via wiring line formed in the module substrate 80 along the vertical direction of the module substrate 80. Thus, the wiring line linking the hybrid filter 21 and the low-noise amplifier 53 can be shortened, and a transmission loss of a reception signal in the first communication band can be reduced.

In addition, in the radio-frequency module 1, the low-noise amplifiers 51 and 53 and the switch 30 may be included in the semiconductor IC 71 disposed on the main surface 80b.

According to the above, the low-noise amplifiers 51, 53 and the switch 30 can be reduced in size and height.

Additionally, the radio-frequency module 1 may further include the third inductor connected between the output terminal of the power amplifier 61 and the hybrid filter 11, and the distance between the third inductor and the hybrid filter 11 may be shorter than the distance between the third inductor and the hybrid filter 21.

According to the above, the wiring line linking the hybrid filter 11 and the third inductor can be shortened, thus a transmission loss of a high-output transmission signal in the first communication band can be reduced and power consumption can be reduced.

In addition, in the radio-frequency module 1, the first acoustic wave resonator, the first inductor, and the first capacitor may be disposed on the main surface 80*a*, and the second acoustic wave resonator, the second inductor, and the second capacitor may be disposed on the main surface 80*a*. When, in plan view of the module substrate 80, (1) the first quadrant Q1 which is the region on the right side and the upper side of the reference point R1 on the module substrate 80, (2) the second quadrant Q2 which is the region on the left side and the upper side of the reference point R1, (3) the third quadrant Q3 which is the region on the left side and the lower side of the reference point R1, and (4) the fourth quadrant Q4 which is the region on the right side and the lower side of the reference point R1 are defined, at least a part of the hybrid filter 21 may be disposed in the first quadrant Q1, at least a part of the power amplifier 61 may be disposed in the second quadrant Q2, at least a part of the third inductor may be disposed in the third quadrant Q3, and at least a part of the hybrid filter 11 may be disposed in the fourth quadrant Q4.

According to the above, the power amplifier 61, the third inductor, and the hybrid filter 11 constituting a transmission path for transmitting a transmission signal in the first communication band are disposed in this order counterclockwise around the reference point R1. Thus, since the transmission path for transmitting a transmission signal in the first communication band can be shortened, a transmission loss of a high-output transmission signal in the first communication band can be reduced, and power consumption can be reduced.

Further, the radio-frequency module 1 may further include the filter 12 having the third acoustic wave resonator and the fourth inductor, and the filter 22 having the fourth acoustic wave resonator and the fifth inductor, the filter 12 may be a transmission-and-reception filter connected to the switch 30, the filter 22 may be a reception-only filter connected to the switch 30, the pass band of each of the hybrid filters 11 and 21 may include n77 of 5G-NR, and the pass band of each of the filters 12 and 22 may include n79 of 5G-NR.

Further, the communication device 5 includes the RFIC 3 that processes radio-frequency signals received by the antennas 2A and 2B, and the radio-frequency module 1 that propagates a radio-frequency signal between an antenna 2 and the RFIC 3.

Accordingly, it is possible to provide the small-sized communication device including the hybrid filter 11 in which the acoustic wave resonator, the inductor, and the capacitor are combined.

Other Embodiments

Hereinbefore, although the radio-frequency module and the communication device according to the present disclosure have been described by illustrating the embodiment, the example and the modification, the present disclosure is not limited to the embodiment, the example and the modification described above. Other embodiments achieved by combining arbitrary constituent elements in the above-described embodiment, example and modification, modifications obtained by applying various modifications conceived by a person skilled in the art to the above-described embodiment without departing from the gist of the present disclosure, and various devices incorporating the radio-frequency module and the communication device according to the present disclosure are also included in the present disclosure.

For example, although the radio-frequency module 1 according to the embodiment includes the hybrid filter 11 for both transmission and reception, the radio-frequency module according to the present disclosure may have a configuration that does not include the hybrid filter 11 for both transmission and reception and includes the hybrid filter 21 for reception only. In this case, the radio-frequency module includes the hybrid filter 21, the low-noise amplifier 53, and the module substrate 80 having the main surfaces 80*a* and 80*b* facing each other. The hybrid filter 21 has the acoustic wave resonators P5 and P6 (first acoustic wave resonators), the capacitor C4 (first capacitor), and the inductors L4, L5, and L6 (first inductors). The pass band width of the hybrid filter 21 is greater than the resonant band width of each of the acoustic wave resonators P5 and P6. One of the acoustic wave resonators P5 and P6, the capacitor C4, and the inductors L4, L5, and L6 is disposed on the main surface 80*a*, and the low-noise amplifier 53 (first radio-frequency component) is disposed on the main surface 80*b*.

According to the above, since some of the circuit elements of the hybrid filter 21 and the first radio-frequency component are distributed to and disposed on both the surfaces of the module substrate 80 with the module substrate 80 interposed therebetween, the radio-frequency module can be reduced in size.

Further, for example, in the radio-frequency module and the communication device according to the embodiment, the example, and the modification, matching elements, such as an inductor and a capacitor, and a switch circuit may be connected between the constituent elements. Note that the inductor may include a wiring inductor formed by a wiring line that connects the constituent elements.

INDUSTRIAL APPLICABILITY

The present disclosure can be widely used in communication devices such as mobile phones, as a radio-frequency module and a communication device applicable to a multi-band system.

The invention claimed is:
1. A radio-frequency module, comprising:
a substrate having a first main surface and a second main surface opposite to each other;
a first hybrid filter having a first acoustic wave resonator, a first inductor, and a first capacitor; and
a first radio-frequency circuitry,
wherein a pass band width of the first hybrid filter is greater than a resonant band width of the first acoustic wave resonator,
one of the first acoustic wave resonator, the first inductor, and the first capacitor is disposed on the first main surface, and
the first radio-frequency circuitry is disposed on the second main surface,
wherein the first radio-frequency circuitry is a first low-noise amplifier,
the radio-frequency module further includes an external connection terminal disposed on the second main surface,
a first power amplifier, a first switch connected to the first hybrid filter for switching between connection and disconnection between the first hybrid filter and an antenna connection terminal, and a second switch connected to the first hybrid filter, the first low-noise amplifier, and the first power amplifier for switching between connection between the first hybrid filter and the first low-noise amplifier and connection between the first hybrid filter and the first power amplifier, the first hybrid filter is a transmission-and-reception filter connected to the first low-noise amplifier and the first power amplifier, and in a plan view of the substrate, the first hybrid filter and the first switch at least partially overlap each other.

2. The radio-frequency module according to claim 1, wherein the first acoustic wave resonator is disposed either on the first main surface or inside the substrate, the first inductor is disposed either on the first main surface or inside the substrate, and the first capacitor is disposed either on the first main surface or inside the substrate.

3. The radio-frequency module according to claim 1, further comprising:

a second hybrid filter having a second acoustic wave resonator, a second inductor, and a second capacitor; and a second low-noise amplifier disposed on the second main surface, wherein a pass band width of the second hybrid filter is greater than a resonant band width of the second acoustic wave resonator, one of the second acoustic wave resonator, the second inductor, and the second capacitor is disposed on the first main surface, the second hybrid filter is a reception-only filter connected between the first switch and the second low-noise amplifier, and in the plan view of the substrate, the second hybrid filter and the second low-noise amplifier at least partially overlap each other.

4. The radio-frequency module according to claim 3, wherein the first low-noise amplifier, the second low-noise amplifier, and the first switch are included in a semiconductor integrated circuit (IC) disposed on the second main surface.

5. The radio-frequency module according to claim 3, further comprising:

a third inductor connected between an output terminal of the first power amplifier and the first hybrid filter, wherein a distance between the third inductor and the first hybrid filter is shorter than a distance between the third inductor and the second hybrid filter.

6. The radio-frequency module according to claim 5, wherein the first acoustic wave resonator, the first inductor, and the first capacitor are disposed on the first main surface, the second acoustic wave resonator, the second inductor, and the second capacitor are disposed on the first main surface, and in a case that, in the plan view of the substrate, (1) a first quadrant which is a region on a right side and an upper side of a reference point on the substrate, (2) a second quadrant which is a region on a left side and the upper side of the reference point, (3) a third quadrant which is a region on the left side and a lower side of the reference point, and (4) a fourth quadrant which is a region on the right side and the lower side of the reference point are defined, at least a part of the second hybrid filter is disposed in the first quadrant, at least a part of the first power amplifier is disposed in the second quadrant, at least a part of the third inductor is disposed in the third quadrant, and at least a part of the first hybrid filter is disposed in the fourth quadrant.

7. The radio-frequency module according to claim 3, further comprising:

a first filter having a third acoustic wave resonator and a fourth inductor; and a second filter having a fourth acoustic wave resonator and a fifth inductor, wherein the first filter is a transmission-and-reception filter connected to the first switch, the second filter is a reception-only filter connected to the first switch, a pass band of each of the first hybrid filter and the second hybrid filter includes n77 of 5G-NR, and a pass band of each of the first filter and the second filter includes n79 of 5G-NR.

8. A radio-frequency module, comprising:

a substrate having a first main surface and a second main surface opposite to each other;

a first hybrid filter having a first acoustic wave resonator, a first inductor, and a first capacitor; and a first radio-frequency circuitry, wherein a pass band width of the first hybrid filter is greater than a resonant band width of the first acoustic wave resonator, one of the first acoustic wave resonator, the first inductor, and the first capacitor is disposed on the first main surface, and the first radio-frequency circuitry is disposed on the second main surface, wherein the first radio-frequency circuitry is a third low-noise amplifier, the radio-frequency module further includes an external connection terminal disposed on the second main surface, the first hybrid filter is a reception-only filter connected to the third low-noise amplifier, and in a plan view of the substrate, the first hybrid filter and the third low-noise amplifier at least partially overlap each other.

9. A communication device, comprising:

a radio-frequency (RF) signal processing circuit configured to process a radio-frequency signal received by an antenna; and a radio-frequency module configured to propagate the radio-frequency signal between the antenna and the RF signal processing circuit, wherein the radio-frequency module includes a substrate having a first main surface and a second main surface opposite to each other;

a first hybrid filter having a first acoustic wave resonator, a first inductor, and a first capacitor, and a first radio-frequency circuitry, wherein a pass band width of the first hybrid filter is greater than a resonant band width of the first acoustic wave resonator, one of the first acoustic wave resonator, the first inductor, and the first capacitor is disposed on the first main surface, and the first radio-frequency circuitry is disposed on the second main surface, wherein the first radio-frequency circuitry is a first low-noise amplifier, the radio-frequency module further includes an external connection terminal disposed on the second main surface, a first power amplifier, a first switch connected to the first hybrid filter for switching between connection and disconnection between the first hybrid filter and an antenna connection terminal, and a second switch connected to the first hybrid filter, the first low-noise amplifier, and the first power amplifier for switching between connection between the first hybrid filter and the first low-noise amplifier and connection between the first hybrid filter and the first power amplifier, the first hybrid filter is a transmission-and-reception filter connected to the first low-noise amplifier and the first power amplifier, and in a plan view of the substrate, the first hybrid filter and the first switch at least partially overlap each other.

10. The communication device according to claim 9, wherein the first acoustic wave resonator is disposed either on the first main surface or inside the substrate, the first inductor is disposed either on the first main surface or inside the substrate, and the first capacitor is disposed either on the first main surface or inside the substrate.

11. The communication device according to claim 9, wherein the radio-frequency module further includes a second hybrid filter having a second acoustic wave resonator, a second inductor, and a second capacitor; and a second low-noise amplifier disposed on the second main surface, wherein a pass band width of the second hybrid filter is greater than a resonant band width of the second acoustic wave resonator, one of the second acoustic wave resonator, the second inductor, and the second capacitor is disposed on the first main surface, the second hybrid filter is a reception-only filter connected between the first switch and the second low-noise amplifier, and in the plan view of the substrate, the second hybrid filter and the second low-noise amplifier at least partially overlap each other.

12. The communication device according to claim 11, wherein the first low-noise amplifier, the second low-noise amplifier, and the first switch are included in a semiconductor integrated circuit (IC) disposed on the second main surface.

13. The communication device according to claim 11, wherein the radio-frequency module further includes a third inductor connected between an output terminal of the first power amplifier and the first hybrid filter, wherein a distance between the third inductor and the first hybrid filter is shorter than a distance between the third inductor and the second hybrid filter.

14. The communication device according to claim 13, wherein the first acoustic wave resonator, the first inductor, and the first capacitor are disposed on the first main surface, the second acoustic wave resonator, the second inductor, and the second capacitor are disposed on the first main surface, and in a case that, in the plan view of the substrate, (1) a first quadrant which is a region on a right side and an upper side of a reference point on the substrate, (2) a second quadrant which is a region on a left side and the upper side of the reference point, (3) a third quadrant which is a region on the left side and a lower side of the reference point, and (4) a fourth quadrant which is a region on the right side and the lower side of the reference point are defined, at least a part of the second hybrid filter is disposed in the first quadrant, at least a part of the first power amplifier is disposed in the second quadrant, at least a part of the third inductor is disposed in the third quadrant, and at least a part of the first hybrid filter is disposed in the fourth quadrant.

15. The communication device according to claim 11, wherein the radio-frequency module further includes a first filter having a third acoustic wave resonator and a fourth inductor; and a second filter having a fourth acoustic wave resonator and a fifth inductor, wherein the first filter is a transmission-and-reception filter connected to the first switch, the second filter is a reception-only filter connected to the first switch, a pass band of each of the first hybrid filter and the second hybrid filter includes n77 of 5G-NR, and a pass band of each of the first filter and the second filter includes n79 of 5G-NR.

16. The communication device according to claim 9, wherein the first radio-frequency circuitry is a third low-noise amplifier, the radio-frequency module further includes an external connection terminal disposed on the second main surface, the first hybrid filter is a reception-only filter connected to the third low-noise amplifier, and in a plan view of the substrate, the first hybrid filter and the third low-noise amplifier at least partially overlap each other.

* * * * *